United States Patent
Lee et al.

(10) Patent No.: US 7,440,316 B1
(45) Date of Patent: Oct. 21, 2008

(54) 8/9 AND 8/10-BIT ENCODING TO REDUCE PEAK SURGE CURRENTS WHEN WRITING PHASE-CHANGE MEMORY

(75) Inventors: Charles C. Lee, Cupertino, CA (US); Frank I-Kang Yu, Palo Alto, CA (US); David Q. Chow, San Jose, CA (US)

(73) Assignee: Super Talent Electronics, Inc, San Jose, CA (US)

( * ) Notice: Subject to any disclaimer, the term of this patent is extended or adjusted under 35 U.S.C. 154(b) by 0 days.

(21) Appl. No.: 11/741,890

(22) Filed: Apr. 30, 2007

(51) Int. Cl.
*G11C 11/00* (2006.01)
(52) U.S. Cl. ........................ 365/163; 365/148
(58) Field of Classification Search ............... 365/163
See application file for complete search history.

(56) References Cited

U.S. PATENT DOCUMENTS

| | | | |
|---|---|---|---|
| 5,933,365 | A | 8/1999 | Klersy et al. |
| 6,512,241 | B1 | 1/2003 | Lai |
| 6,545,907 | B1 * | 4/2003 | Lowrey et al. ............ 365/163 |
| 6,768,665 | B2 * | 7/2004 | Parkinson et al. .......... 365/113 |
| 6,869,883 | B2 | 3/2005 | Chiang et al. |
| 7,026,639 | B2 | 4/2006 | Cho et al. |
| 7,078,273 | B2 | 7/2006 | Matsuoka et al. |
| 7,103,718 | B2 | 9/2006 | Nickel et al. |
| 2003/0223285 | A1 | 12/2003 | Khouri et al. |
| 2004/0228163 | A1 | 11/2004 | Khouri et al. |
| 2004/0248339 | A1 | 12/2004 | Lung |
| 2004/0256610 | A1 | 12/2004 | Lung |
| 2005/0185572 | A1 | 8/2005 | Resta et al. |
| 2006/0018183 | A1 | 1/2006 | De Sandre et al. |
| 2006/0097239 | A1 | 5/2006 | Hsiung |
| 2006/0126381 | A1 | 6/2006 | Khouri et al. |
| 2006/0203542 | A1 | 9/2006 | Kurotsuchi et al. |
| 2006/0274574 | A1 | 12/2006 | Choi et al. |

* cited by examiner

*Primary Examiner*—Son L Mai
(74) *Attorney, Agent, or Firm*—gPatent LLC; Stuart T. Auvinen (57) ABSTRACT

Phase-change memory (PCM) cells store data using alloy resistors in high-resistance amorphous and low-resistance crystalline states. The memory cell's reset current can be double a set current, causing peak currents to depend on write data. When all data bits are reset to the amorphous state, a very high peak current is required. To reduce this worst-case peak current, the data is encoded before storage in the PCM cells. An 8/10 encoder adds 2 bits but ensures that no more than half of the data bits are reset. An 8/9 encoder adds an indicator bit, and inverts the 8 bits to ensure that no more than half of the bits are reset. The indicator bit indicates when the 8 bit are inverted, and when the 8 bits are un-inverted. Peak currents are thus reduced by encoding to reduce reset data bits.

20 Claims, 10 Drawing Sheets

8/9 AND 8/10-BIT ENCODING TO REDUCE PEAK SURGE CURRENTS WHEN WRITING PHASE-CHANGE MEMORY

FIELD OF THE INVENTION

This invention relates to phase-change memories, and more particularly to peak-current reduction when writing phase-change memories.

BACKGROUND OF THE INVENTION

Computer code, instructions, user data and other kinds of data have been stored in main memories and peripheral memories that employ a wide variety of technologies. Main memories often use dynamic-random-access memory (DRAM), while faster cache memories and on-chip memories may use static random-access memory (SRAM). Read-only-memory (ROM) may use fuses or masked metal options, or may use electrically-erasable programmable read-only memory (EEPROM) cells. These are randomly-accessible memories since individual words can be read or written without disturbing nearby data. Often individual bytes may be written.

Mass storage memory is block-addressable, where a block of 512 or more bytes must be read or written together as a block. Individual words of 64 bytes or less cannot be separately written without re-writing the whole 512-byte block. Mass storage devices include rotating magnetic disks, optical disks, and EEPROM arranged as flash memory.

Traditionally, flash memory has been used for non-volatile storage. Another kind of non-volatile memory, phase-change memory, was discovered in the 1960's, and was even written about in a paper in Electronics magazine in September 1970 by the founder of Intel Corp., Gordon Moore. However, despite the long-felt need, this 40-year-old technology has not yet been widely used in personal computers and other systems.

Phase-change memory (PCM) uses a layer of chalcogenide glass that can be switched between a crystalline and an amorphous state. The chalcogenide glass layer can be an alloy of germanium (Ge), antimony (Sb), and tellurium (Te). This alloy has a high melting point, which produces the amorphous state when cooled from the melting point. However, when the solid alloy is heated from the amorphous state, the alloy transforms into a crystalline state at a crystallization temperature than is below its melting point. Such heating can be provided by an electric current through the alloy. The state change may occur rapidly, such as in as little as 5 nanoseconds.

One problem with phase-change memory is the relatively high current required to reset memory cells into the amorphous state, compared with the lower current required to set memory cells into the crystalline state. The peak reset current can be double or more the peak set current. This difference in peak currents can cause a data dependency to current drain in a PCM chip.

The differing peak currents may cause unwanted side effects, such as I-R voltage drops on power or ground lines within or external to the PCM chip, and data disturbance or even data loss in extreme cases. The surging peak currents may exceed the filtering provided by capacitors internal or external to the PCM chips. Since the peak currents are data-dependent, failures may occur sporadically and be hard to detect, and even harder to trace back to specific data patterns.

What is desired is a phase-change memory that is less sensitive to peak currents that vary for amorphous and crystalline states. A phase-change memory that compensates for peak current variations between amorphous and crystalline states is desirable. A phase-change memory that detects data patterns that can cause excessive peak currents and that can alter these data patterns to reduce peak currents is desirable.

DETAILED DESCRIPTION

The present invention relates to an improvement in phase-change memories. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Phase-Change Memory—FIGS. 1-4

Figure 1:
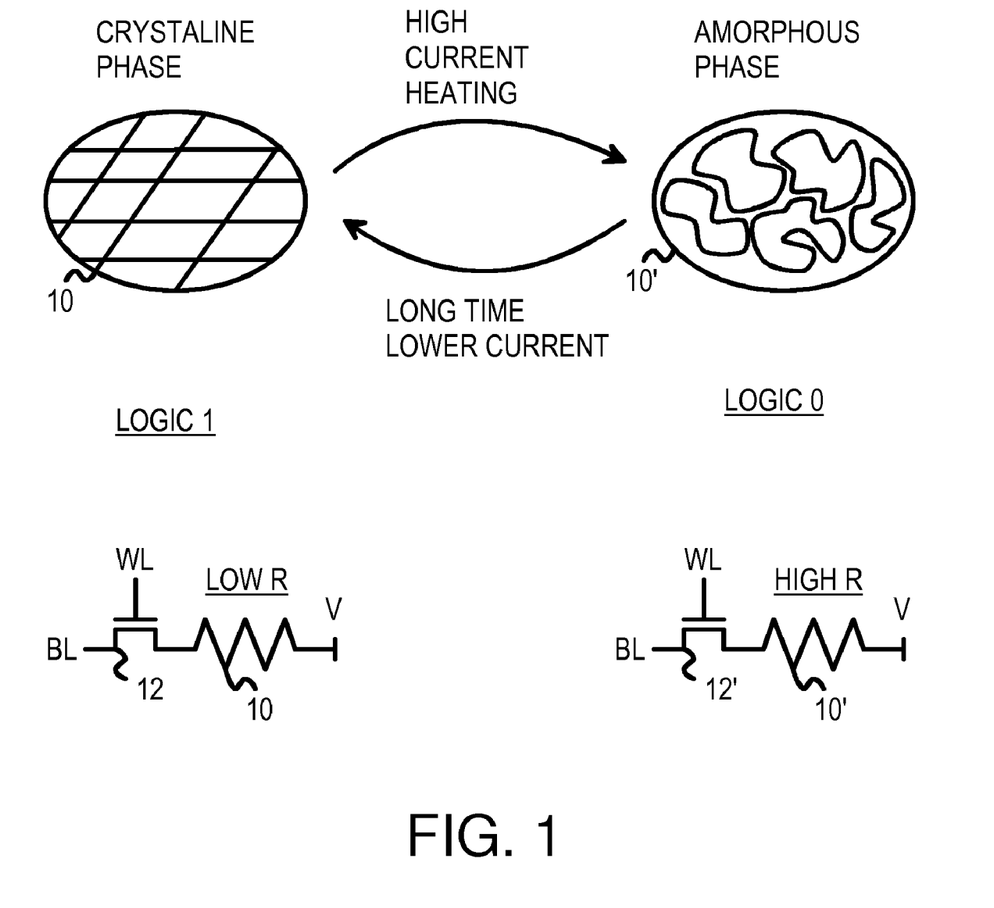
FIG. 1 shows a phase-change memory cell.

FIG. 1 shows a phase-change memory cell. Phase-change memory (PCM) uses a layer of chalcogenide glass that can be switched between a crystalline and an amorphous state. The chalcogenide glass layer can be an alloy of germanium (Ge), antimony (Sb), and tellurium (Te). This alloy has a high melting point, which produces the amorphous state when cooled from the melting point. However, when the solid alloy is heated from the amorphous state, the alloy transforms into a crystalline state at a crystallization temperature than is below its melting point. Such heating can be provided by an electric current through the alloy. The state change may occur rapidly, such as in as little as 5 nanoseconds.

In FIG. 1, when alloy resistor 10 is in the crystalline state, its resistivity is low. The crystalline state represents a logic high or 1. A PCM memory cell has alloy resistor 10 in series with select transistor 12 between a bit line BL and a voltage V. When V is a low voltage such as ground, and word line WL is driven high, the bit-line voltage is pulled from a high pre-charged state to ground through select transistor 12 and alloy resistor 10 due to the low resistance of alloy resistor 10.

When alloy resistor 10' is in the amorphous state, its resistivity is high. The amorphous state represents a logic low or 0. Another PCM memory cell has alloy resistor 10' in series with select transistor 12' between a bit line BL and a voltage V. When V is a low voltage such as ground, and word line WL is driven high, the bit-line voltage remains in its high or pre-charged state, since the high resistance of alloy resistor 10' limits current through select transistor 12'.

Note that the assignment of logical 0 and logic 1 states to the crystalline and amorphous states is arbitrary. The crystalline state could be assigned logical 1 or logical 0, with the amorphous state having the opposite logical value.

Alloy resistor 10 may be a small layer that is integrated with select transistor 12, such as a layer over or near the source terminal of transistor 12. Alternately, alloy resistor 10 may be a separate resistor device, such as a patterned line or snaking line between the source of select transistor 12 and ground.

When a high current is passed through alloy resistor 10, the alloy can transform from the crystalline state into the amorphous state. The high current creates resistive heating in alloy resistor 10 and the melting temperature is rapidly reached, causing the crystal to melt into a liquid. Upon rapid cooling, alloy resistor 10 solidifies into the amorphous state since there is little time for crystals to grow during cooling.

When a lower current is passed through alloy resistor 10 for a long period of time, the crystalline temperature is reached or exceeded. However, the current is not sufficient to cause the higher melting temperature to be reached. The amorphous alloy begins to crystallize over this long time period. For example, small crystal domains within the amorphous state may grow and absorb other domains until alloy resistor 10 contains one or just a few crystal domains.

Thus alloy resistor 10' transforms from the high-resistance amorphous state into the low-resistance crystalline state by applying a moderate current for a relatively long period of time, allowing the crystal to grow at the crystalline temperature. Alloy resistor 10 transforms from the low-resistance crystalline state into the high-resistance amorphous state by applying a high current for a relatively short period of time, allowing the crystal to melt into an amorphous blob at the melting temperature.

Figure 2:
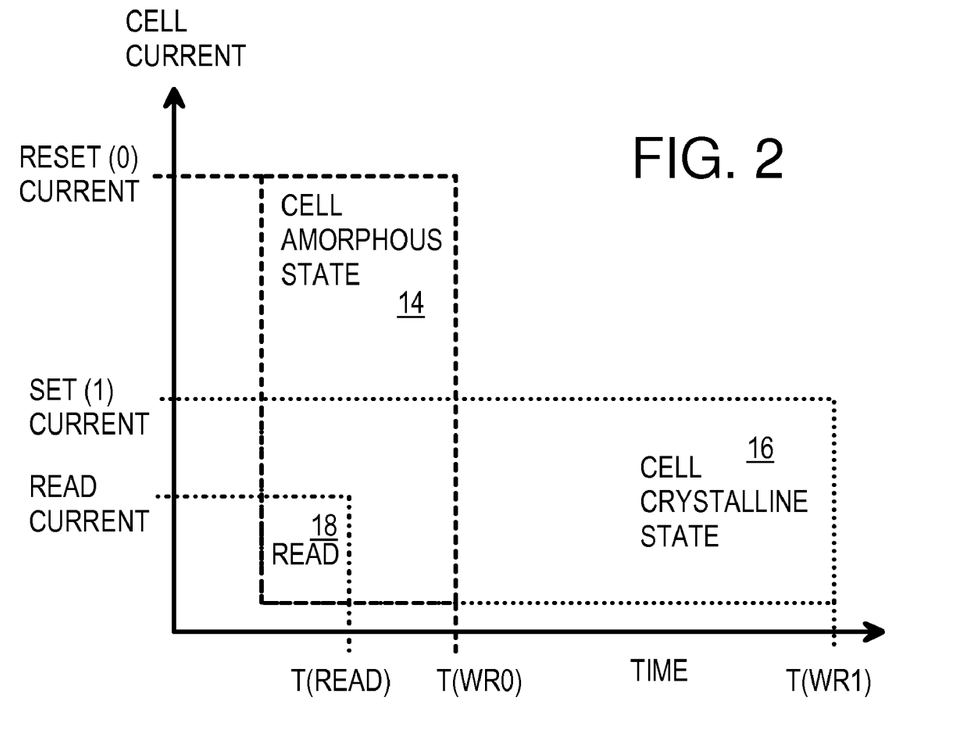
FIG. 2 is a graph of current and time to transform states in a phase-change memory cell.

FIG. 2 is a graph of current and time to transform states in a phase-change memory cell. Amorphous state 14 is reached when a high current (the reset current) is applied for a time of T(WR0). Crystalline state 16 is reached when a moderate current, the set current, is applied for a longer period of time T(WR1). These states are retained when currents below the moderate current are applied, or when currents are applied for short periods of time. State transformations, or partial state transformations, may occur when the full currents and times are not both met, such as applying the set current for less than the set time. These partial state transformations are undesirable.

The PCM cell can safely be read by applying a lower read current for a short period of time. For example, the read current can be less than either the set or reset currents. Reading 18 has the read current applied for less than the set or reset times, T(WR1), T(WR0), respectively. For example, the read time T(READ) can be less than half of the reset time, and the read current can be less than half of the set current. The reset current can be double or more the set current, and the set time can be double, triple, 5×, or more of the reset time.

Figure 3:
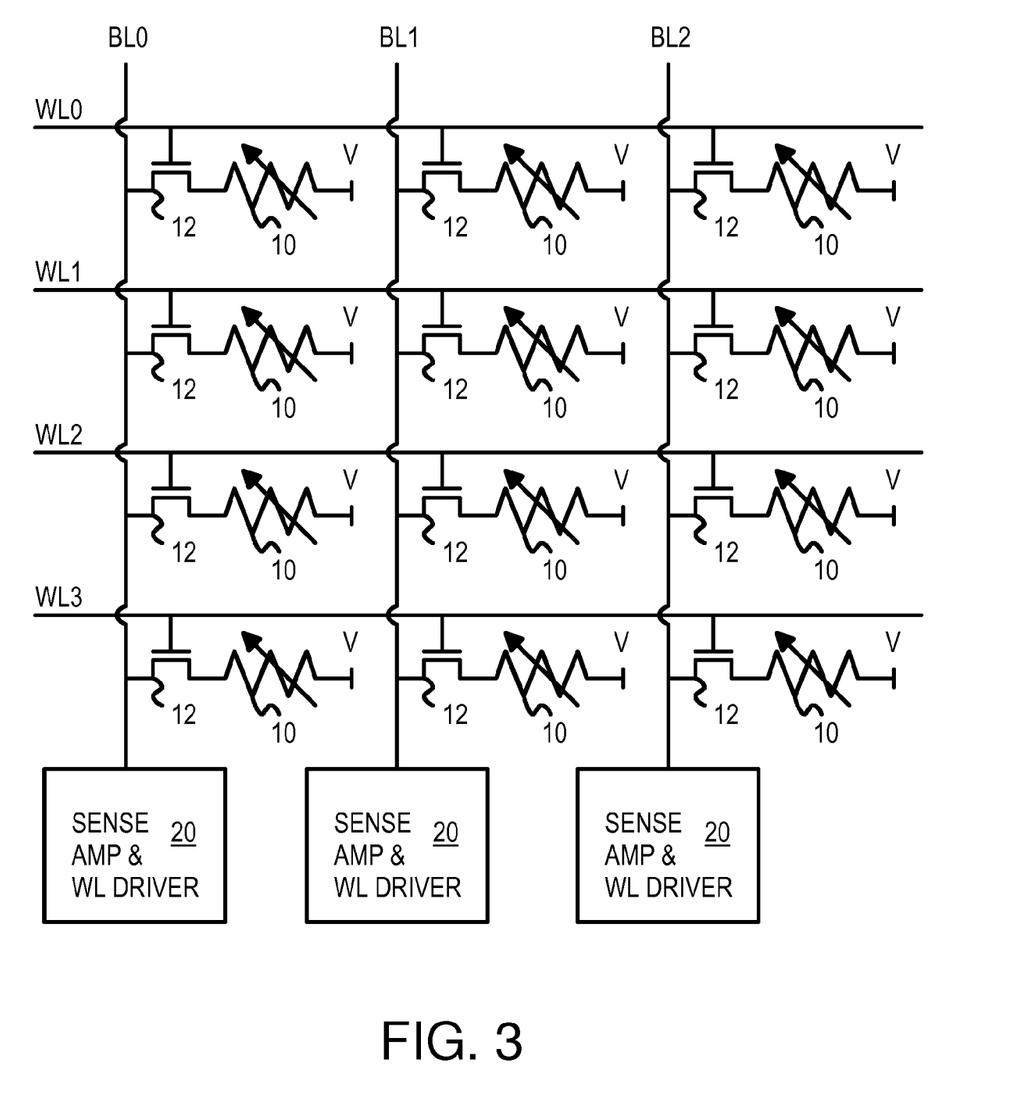
FIG. 3 shows an array of phase-change memory cells.

FIG. 3 shows an array of phase-change memory cells. Word lines WL0:3 are applied to the gates of select transistors 12, while bit lines BL0:2 connect to the drains of select transistors 12. Alloy resistors 10 are in series between the sources of select transistors 12 and a cell voltage V, which could be ground, power, or some other voltage, and could be switched on and off, such as for power down or to disable an array or block.

Alloy resistors 10 each can be in a high-resistance amorphous state, or in a low-resistance crystalline state. The current drawn from a bit line by select transistor 12 and alloy resistor 10 in the selected word line (row) is sensed by sense amplifiers 20 and amplified and buffered to generate the data read from the cell. The current drawn through alloy resistor 10 is less than or equal to the read current.

During writing, sense amplifiers 20 activate bit-line drivers that drive the set or reset current onto the bit lines and through the selected alloy resistor. After the current is applied for the set or reset time, alloy resistor 10 is transformed into the new state, either the amorphous or crystalline state. One cell per column is written, since only one of the word lines is activated at a time. Columns being written into the 0 state have the reset current applied to the bit line for the reset time period, while columns being written into the 1 state have the set current applied for the set time period.

Figure 4:
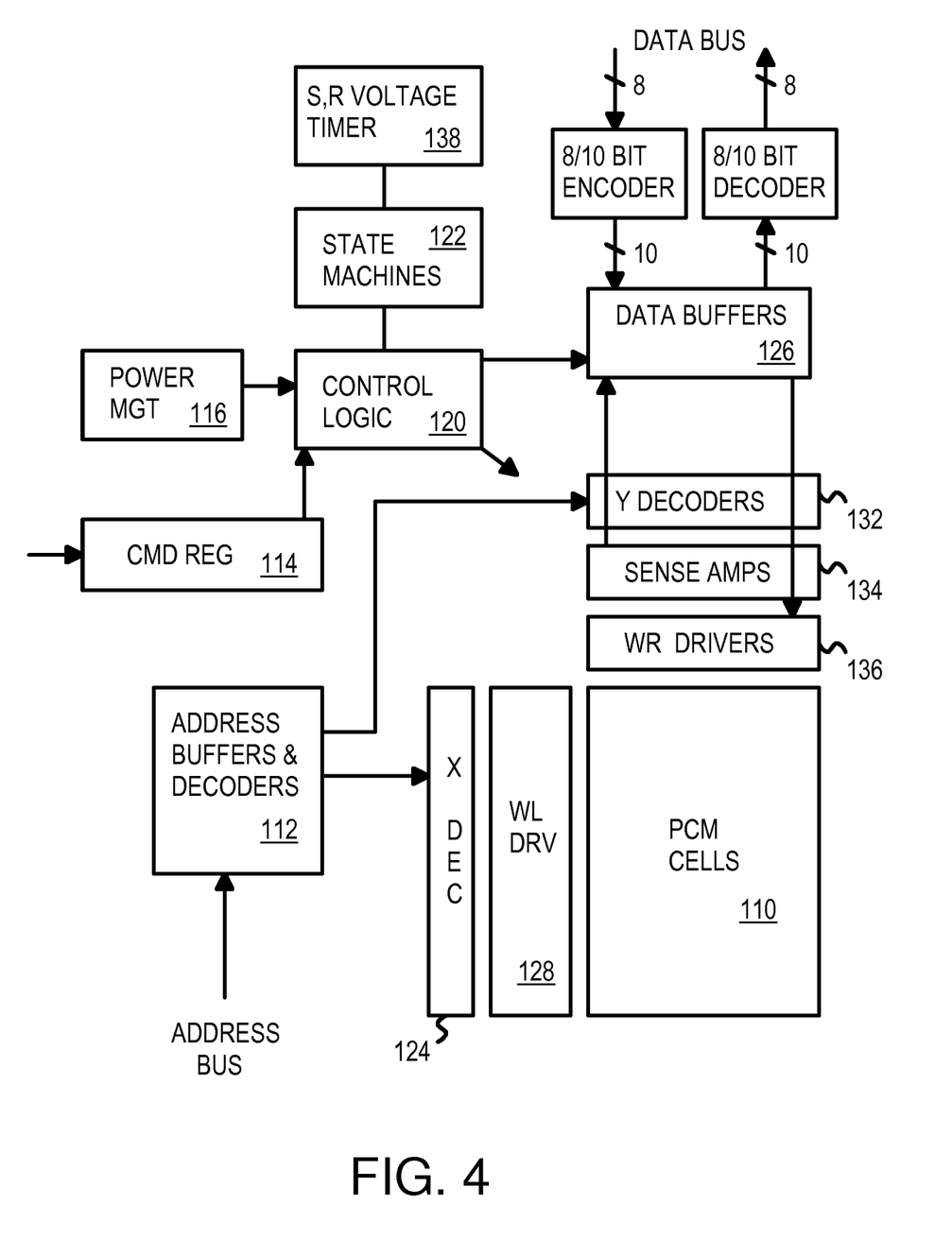
FIG. 4 shows a phase-change memory.

FIG. 4 shows a phase-change memory. A PCM chip may include some or all of the blocks shown in FIG. 4, and other blocks, or some of the functions may be performed by a separate PCM controller.

PCM cells 110 is an array of rows and columns of select transistors and alloy resistors that change between crystalline and amorphous phase states. The high and low resistance values of the 2 phase states are sensed by sense amplifiers 134 when a read current is drawn through a selected row of PCM cells. Word line drivers 128 drives one row or word line in PCM cells 110 while the other rows are disabled. A row portion of an address applied to address decoder 112 is further decoded by X decoder 124 to select which row to activate using word line drivers 128.

A column portion of the address applied to address decoder 112 is further decoded by Y decoder 132 to select a group of bit lines for data access. Data buffers 126 may be a limited width, such as 64 bits, while PCM cells may have a larger number of bit lines, such as 8×64 columns. One of the 8 columns may be selected by Y decoder 132 for connection to data buffers 126.

During writing, external data is collected by data buffers 126 and applied to write drivers 136. Write drivers 136 generate voltages or currents so that the set currents are applied to bit lines for PCM cells that are to be written with a 1, while higher reset currents are applied to bit lines for PCM cells to be reset to 0.

Set, reset voltage timer 138 includes timers that ensure that the set currents are applied by write drivers 136 for the longer set period of time, while the reset currents are applied for the shorter reset time period, and write drivers 136 for reset PCM cells are disabled after the reset time period.

State machines 122 can activate set, reset voltage timers 138 and cause control logic 120 to disable write drivers 136 after the set and reset time periods have expired. State machines 122 can generate various internal control signals at appropriate times, such as strobes to pre-charge bit lines and latch sensed data into data buffers 126.

Command register 114 can receive commands that are decoded and processed by control logic 120. External control signals such as read/write, data strobes, and byte enables may also be received in some embodiments. Command register 114 may be replaced by a command decoder in some embodiments. Power management unit 116 can power down blocks to reduce power consumption, such as when the PCM chip is de-selected. Since PCM cells 110 are non-volatile, data is retained when power is disconnected.

There may be several arrays of PCM cells 110 and associated logic on a large PCM chip. An array-select portion of the address can be decoded by address decoders 112 to enable one of the many arrays or blocks on the PCM chip.

Figure 5:
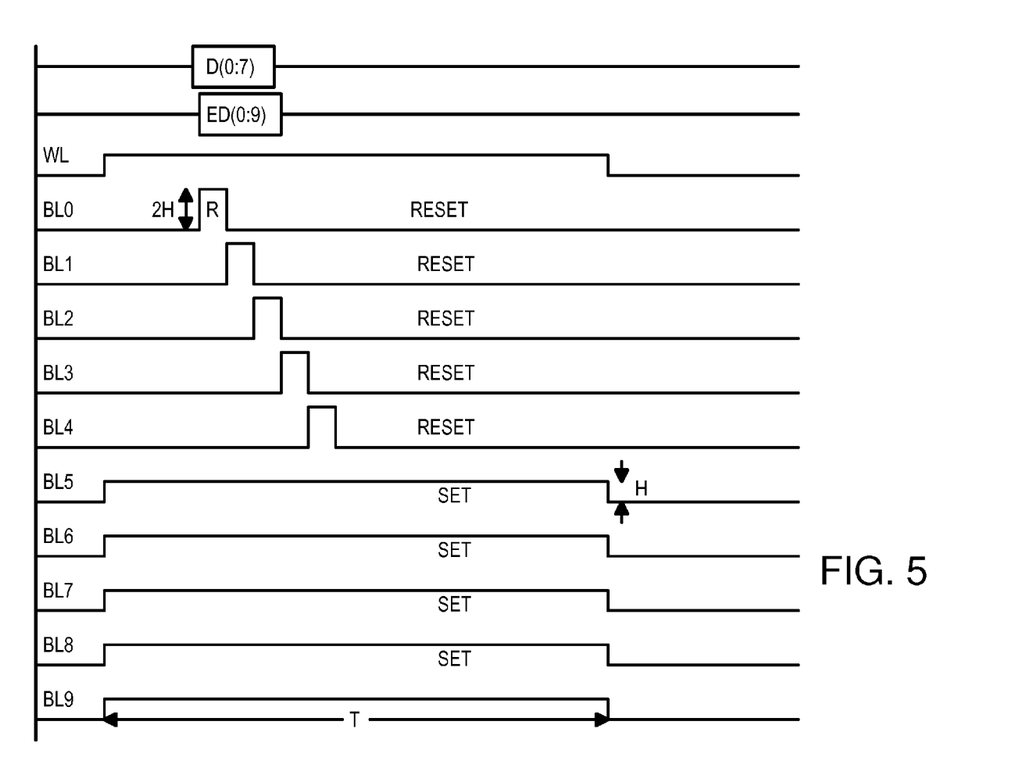
FIG. 5 is a waveform diagram of 8/10 bit encoding to reduce data-pattern-sensitive peak currents in a phase-change memory.

Peak Current Reduction—FIG. 5

The peak reset current may be double the peak set current, as FIG. 2 shows. Since memory chips tend to be multiple bits in width, some of the memory cells may be reset to 0 (amorphous state) while other memory cells may be set to 1 (crystalline state). The number of cells being set and reset depends on the data being written into the memory chip. For example, the data word 11111111 has a much lower peak current than the data word 00000000, while the data word 00001111 has an intermediate peak current.

The inventors have realized that since the peak current is data dependent, the peak current can be reduced by altering the data being written into the PCM memory chip. Data words with many 0's have a high peak current and are undesirable, while data words with few 0's are desirable.

The data words may be altered by deterministic encoding. A few additional bits may be added to each data word to allow for this encoding. For example, an 8-bit data word can be encoded as a 10-bit encoded word. The 10-bit encoded word is stored in the phase-change-memory chip.

The number of possible values of the data word increases by $2^M$, where M is the number of additional bits. For 8/10 bit encoding, 2 bits are added, and the number of possible values (combinations of the 8 or 10 bits) increases from 256 to 1024. Since there are 1024 available values of the 10-bit code, and only 256 coded values are needed, the lowest-peak-power values of the 10-bit code can be used, while the high peak-current data values such as 0000000000, 0000000001, 0000000010, 0000000100, 0000001000, etc. can be unused. Only the 256 lowest peak-power data combinations can be used in the most optimal encoding. Other encodings that are not as optimal, yet still eliminate the most extreme peak-current data words can still be useful. A wide variety of 8/10 codes may be used.

FIG. 5 is a waveform diagram of 8/10 bit encoding to reduce data-pattern-sensitive peak currents in a phase-change memory. An 8-bit data input D(0:7) is encoded as a 10-bit code word ED(0:9). The 10-bit code word ED(0:9) is actually stored in the memory cells of the PCM. The 8-bit data input D(0:7) is input to the pins of the PCM chip, but is converted to 10-bit code word ED(0:9) before actual storage inside the PCM array.

There are 637 combinations of 10 bits are there that have 5 1's and 5 0's. Only 256 of these combinations are needed as valid encoded words. An 8/10 encoding by IBM and used for PCI Express has an evenly distributed surge power and is a useful code, as are other possible codes.

When the internal word line is driven high, the select transistors turn on, coupling the alloy resistors to the bit lines. A high voltage can be applied to the bit lines to force a large current through the select transistors and the alloy resistors. This current heats the alloy resistors to either the crystalline temperature (set) or to the melting temperature (reset), depending on the encoded data bit being written through that bit line.

The encoded data ED(0:9) is optionally latched and drives the bit lines high or higher, depending on the 10 data bits in ED(0:9). In this waveform, the data is 1111100000, with bit lines BL0:4 being driven with reset pulses, while bit lines BL5:9 are being driven with set pulses. The reset pulses are for a short duration of time R, but are a much larger peak current of 2H. The higher voltage is applied to bit lines BL0:4 to generate the higher peak current of the reset pulses.

The set pulses are for a longer duration of time T, but have a smaller peak current of H. The high voltage is applied to bit lines BL5:9 to generate the moderately high peak current of the set pulses.

Since the reset peak current (2H) is double the set peak current (H), the maximum peak current of this data pattern is 5*(2H)+5*(H), or 15H. This can be the maximum peak current for an 8/10 encoded PCM, since there are at least 256 data values that have 5 or fewer 0's in the 10 bits.

In comparison, an un-encoded 8-bit data word with all 0's would have a peak current of 8*(2H) or 16H. Thus the worst-case peak current has been reduced somewhat using 8/10 bit encoding. Other 8/10 codes may achieve better reduction of peak currents.

Figure 6:
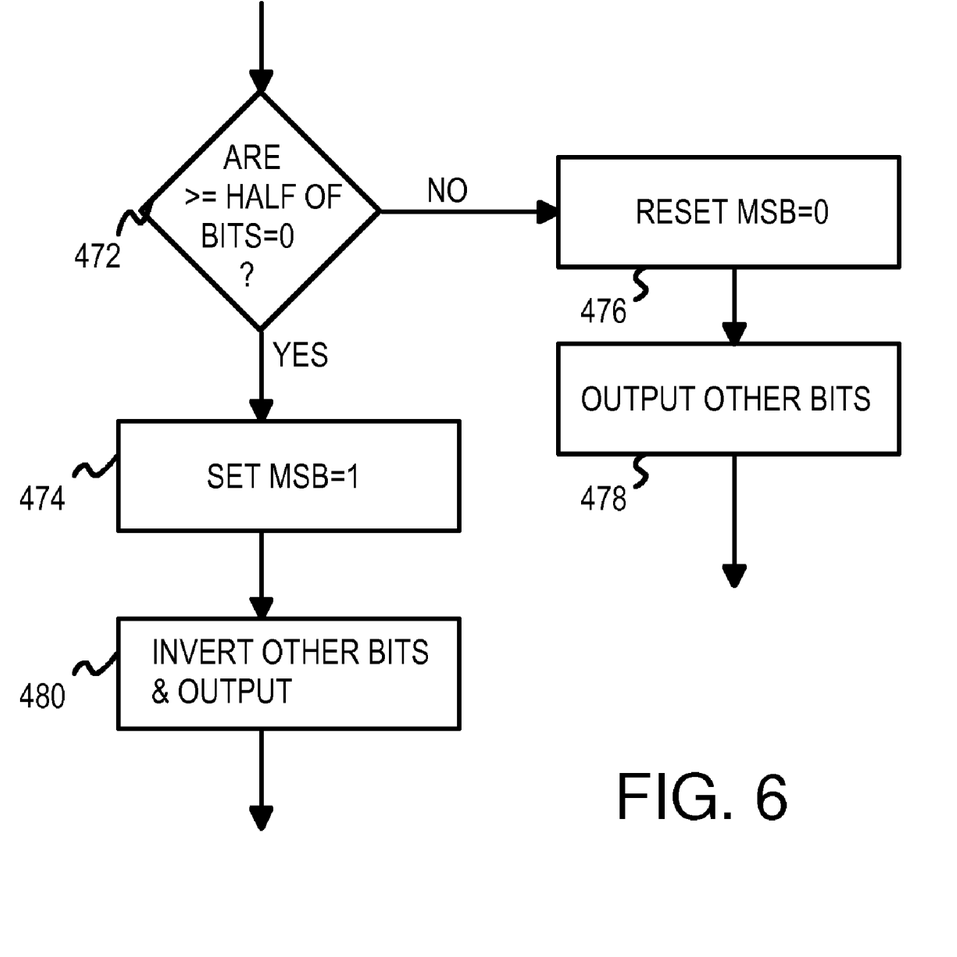
FIG. 6 is a flowchart of a simple encoding scheme that adds 1 bit to reduce the worst-case peak current in a phase-change memory.

8/9 Bit Encoding to Reduce Peak Current—FIG. 6

Adding 2 additional bits for encoding is somewhat undesirable since peak current increased due to the extra 2 bits. Also, the additional 2-bit storage increases the cost of the memory. Adding just 1 bit is preferable to adding 8 bits. An 8/9 code can be used rather than an 8/10 code, although the number of 0's and 1's may vary, rather than be equal. Thus some data-pattern-dependent variation in peak-current is the cost for reduced memory size.

FIG. 6 is a flowchart of a simple encoding scheme that adds 1 bit to reduce the worst-case peak current in a phase-change memory. Each data word input to the PCM chip is operated on using the routine shown in FIG. 6 to encode the data word for writing into the PCM array of memory cells.

When half or more of the bits in the input data word are 0's, step 472, the peak current is high due to the many bits being reset. Since the set current pulse has a lower peak current than the reset current pulse, peak current can be reduced by setting the majority of the bits rather than resetting the majority of the bits.

A new bit, the most-significant-bit (MSB), is attached to the data word. The MSB acts as an indicator to indicate when the data word was altered. The MSB is 1 when the data word was altered to reduce peak current, and is 0 when the data word is unchanged. For example, when the data word is 8 bits, the addition of the MSB creates a 9-bit encoded word. When the MSB of the 9-bit encoded word is 0, then the 8 LSB's are the input data word. However, when the MSB of the 9-bit encoded word is 1, the 8 LSB's are the inverse of the input data word.

When half or more of the bits in the input data word are 0's, step 472, then the MSB is set, step 474, to indicate that the data word is altered to reduce peak current. The 8 bits of the data word are each inverted, step 480, and the MSB and inverted data word are concatenated and output as the encoded data word that is written into the PCM array.

When less than half of the bits in the input data word are 0's, step 472, then the MSB is cleared, step 476, to indicate that the data word is unaltered. The 8 bits of the data word are not changed. The MSB and original, non-inverted data word are concatenated and output as the encoded data word that is written into the PCM array, step 478.

Figure 7:
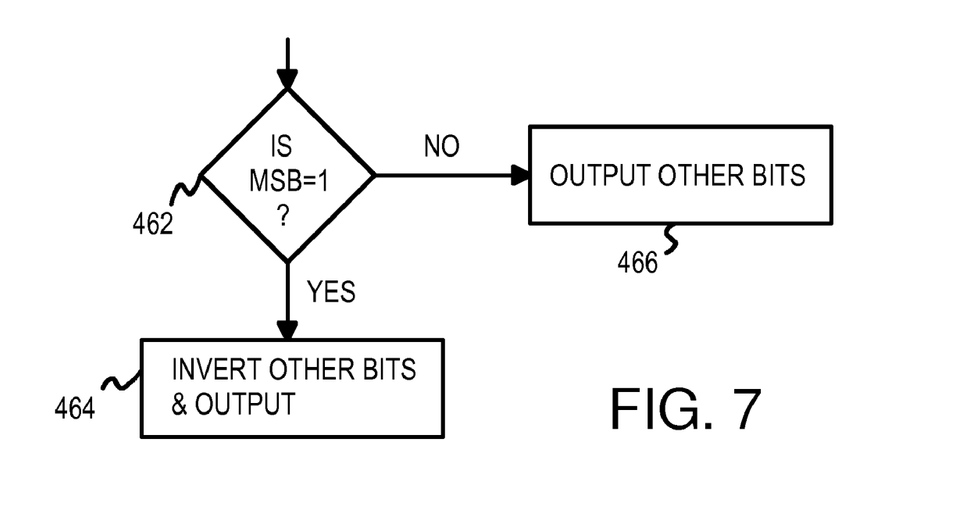
FIG. 7 is a flowchart of a simple decoding scheme that checks and removes a MSB indicator to recover the original data word.

FIG. 7 is a flowchart of a simple decoding scheme that checks and removes a MSB indicator to recover the original data word. While FIG. 6 shows encoding for data writes, FIG. 7 shows decoding of stored data for a data read.

Each encoded data word read out of the array of PCM memory cells on the PCM chip is operated on using the routine shown in FIG. 7 to decode the encoded data word to recover the original data word. The recovered original data word can be output from the PCM chip.

The MSB indicator of the encoded data word read out of the PCM cells is examined, step 462. When the MSB indictor is 1, step 462, then the other 8 bits are inverted and output as the recovered data word, step 464. The inversion can be a bit-wise inversion.

When the MSB indictor is 0, step 462, then the other 8 bits were not altered. The other 8 bits are output as the recovered data word, step 466. Thus the original data word is quickly recovered by examining the MSB indicator.

Figure 8:
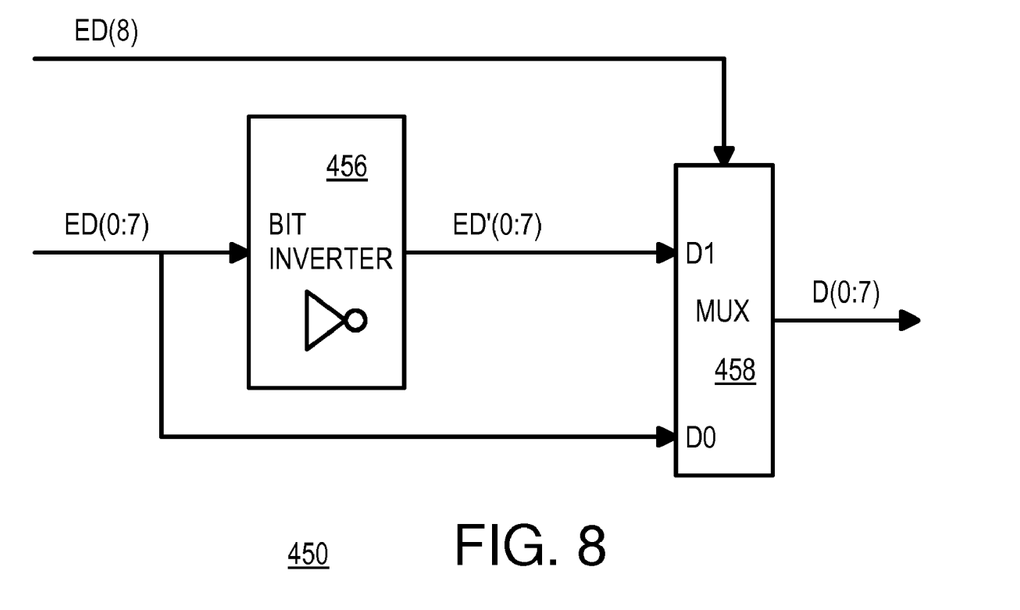
FIG. 8 shows a decoder for a reduced-peak current phase-change memory.

FIG. 8 shows a decoder for a reduced-peak current phase-change memory. Decoder 450 receives a 9-bit encoded data word ED(0:8) that is read from the PCM memory cells during a read operation. Decoder 450 generates an 8-bit recovered data word, D(0:7).

Bit inverter 456 receives the lower 8 bits of the stored encoded data word, ED(0:7), and inverts each bit to generate inverted encoded bits ED'(0:7). Both encoded data bit ED(0:7) and inverted encoded data bit ED'(0:7) are input to mux 458 as the data inputs D0, D1, respectively.

The MSB indicator, ED(8), which was stored in the PCM memory cells as part of the encoded data word, is applied as the select input to mux 458. When the MSB indicator, ED(8), is 1, then data input D1 is selected and inverted encoded bits ED'(0:7) are output as the recovered data word D(0:7). The data word was inverted before storage, and is now being re-inverted to recover the original data.

When the MSB indicator, ED(8), is 0, then data input D0 is selected and un-inverted encoded bits ED(0:7) are output as the recovered data word D(0:7). The original data word had fewer than half of its data bit in the low (reset) state, so inversion was not necessary.

Figure 9:
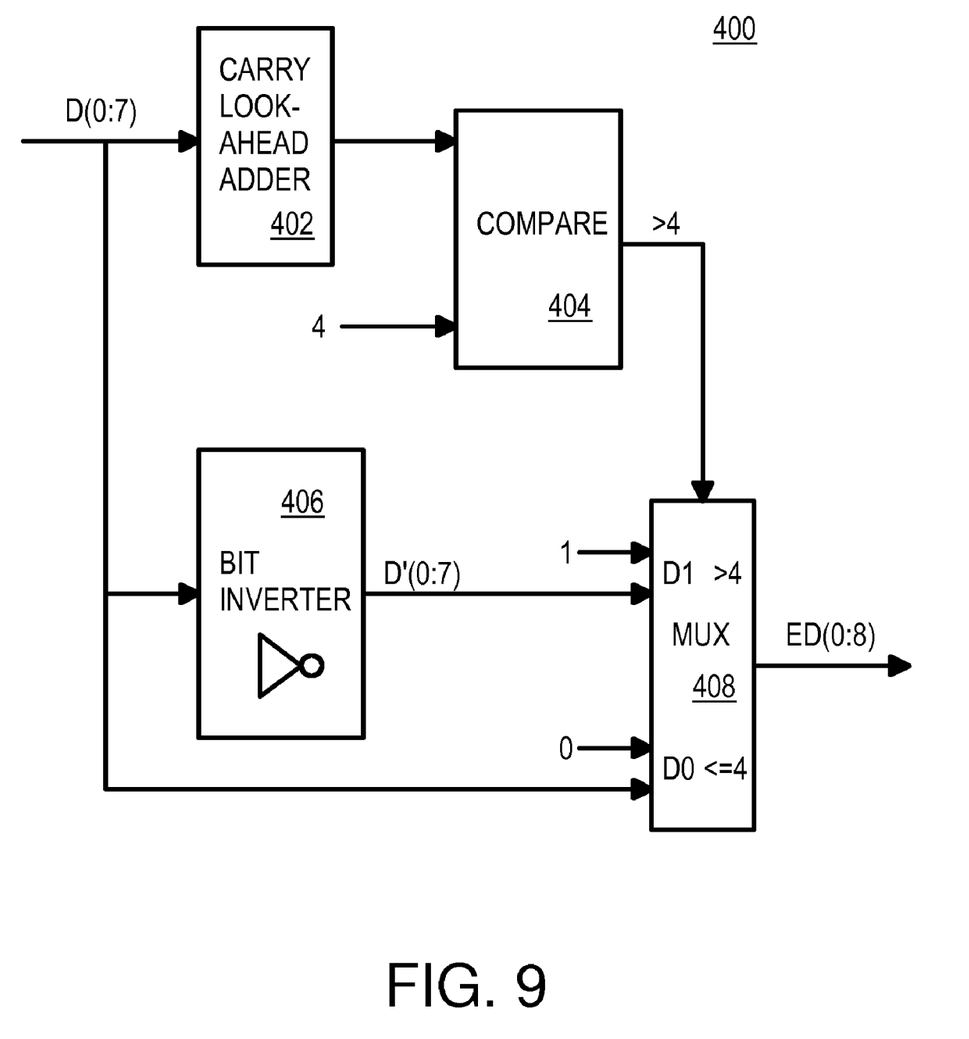
FIG. 9 shows an 8/9 encoder to reduce peak currents in a phase-change memory.

FIG. 9 shows an 8/9 encoder to reduce peak currents in a phase-change memory. Encoder 400 receives an 8-bit data word, D(0:7) and generates a 9-bit encoded data word ED(0:8) that is stored in the PCM memory cells during a write operation.

Bit inverter 406 receives the original 8-bit data word, D(0:7), and inverts each bit to generate inverted bits D'(0:7). Both data word D(0:7) and inverted bits D'(0:7) are input to mux 408 as bits 0:7 of data inputs D0, D1, respectively. A high (1) is applied to bit 8 of data input D1, while a low (0) is applied to bit 8 of data input D0. These are the MSB data inputs to mux 408.

Carry-lookahead adder 402 adds together all 8 bits of data word D(0:7), without regard to bit-significance. Carry-lookahead adder 402 generates a count of the number of 1 bits in the data word. For example, data words 11110000, 10101010, 00001111, 10000111 all generate the same count of 4 from carry-lookahead adder 402.

The count of 1's from carry-lookahead adder 402 is compared to the number 4 by comparator 404. When the number of 1's is less than 4, there are more than 4 0's, and the peak current is too high. The output of comparator 404 goes high when there are <4 1's causing mux 408 to select its D1 input. The 8 bits output from mux 408 are the MSB=1, and the inverted bits D'(0:7). The 5 or more 0 bits are converted to lower-peak-current 1's by the inversion, so peak current is reduced by the encoding.

When the number of 1's is greater than 4, there are 3 or fewer 0's, and the peak current is not too high. The output of comparator 404 goes low and is applied as the select or control input to mux 408. Mux 408 selects its D0 input. The 8 bits output from mux 408 are the MSB=0, and the 8 bits of data input D(0:7).

Figure 10:
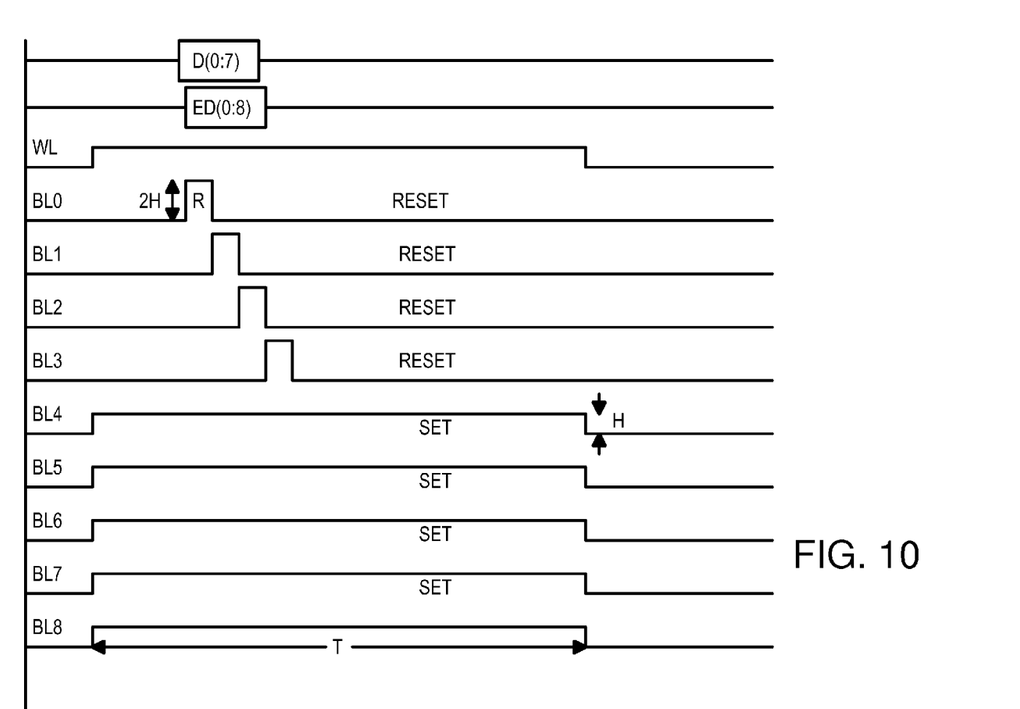
FIG. 10 is a waveform diagram of 8/9 bit encoding to reduce data-pattern-sensitive peak currents in a phase-change memory.

FIG. 10 is a waveform diagram of 8/9 bit encoding to reduce data-pattern-sensitive peak currents in a phase-change memory. An 8-bit data input D(0:7) is encoded as a 9-bit code word ED(0:8). Encoder 400 of FIG. 9 could be used. The 9-bit code word ED(0:8) is stored in the memory cells of the PCM. The 8-bit data input D(0:7) is input to the pins of the PCM chip, but is converted to 9-bit code word ED(0:8) before actual storage inside the PCM array.

When the internal word line is driven high, the select transistors turn on, coupling the alloy resistors to the bit lines. A high voltage can be applied to the bit lines to force a large current through the select transistors and the alloy resistors. This current heats the alloy resistors to either the crystalline temperature (set) or to the melting temperature (reset), depending on the encoded data bit being written through that bit line.

The encoded data ED(0:8) is optionally latched and drives the bit lines high or higher, depending on the 9 data bits in ED(0:8). In this waveform, the data is 111110000, with bit lines BL0:3 being driven with reset pulses, while bit lines BL4:8 are being driven with set pulses. The reset pulses are for a short duration of time R, but are a much larger peak current of 2H. The higher voltage is applied to bit lines BL0:3 to generate the higher peak current of the reset pulses.

The set pulses are for a longer duration of time T, but have a smaller peak current of H. The high voltage is applied to bit lines BL4:8 to generate the moderately high peak current of the set pulses.

Since the reset peak current (2H) is double the set peak current (H) in this example, the maximum peak current of this data pattern is 4*(2H)+5*(H), or 13H. This is the maximum peak current for an 8/9 encoded PCM using encoder 400 (FIG. 9), since there are never more than 4 0's and 4 reset pulses in encoded data.

In comparison, an un-encoded 8-bit data word with all 0's would have a peak current of 8*(2H) or 16H. Thus the worst-case peak current has been reduced by 3H (19%) using 8/9 bit encoding. Other 8/9 codes may achieve better reduction of peak currents but require more complex encoders.

Encoding Examples

The following are a few examples of 8-bit data-word inputs and 9-bit codeword outputs using encoder 400 of FIG. 9:

| Data Word | #0's | Encoded Word | #0's |
|---|---|---|---|
| 00001100 | 6 | 111110011 | 2 |
| 00000000 | 8 | 111111111 | 0 |
| 00111111 | 2 | 000111111 | 3 |
| 00011111 | 3 | 000011111 | 4 |
| 00001111 | 4 | 111110000 | 4 |
| 01010100 | 5 | 110101011 | 3 |

Many other examples could be shown.

Figure 11:
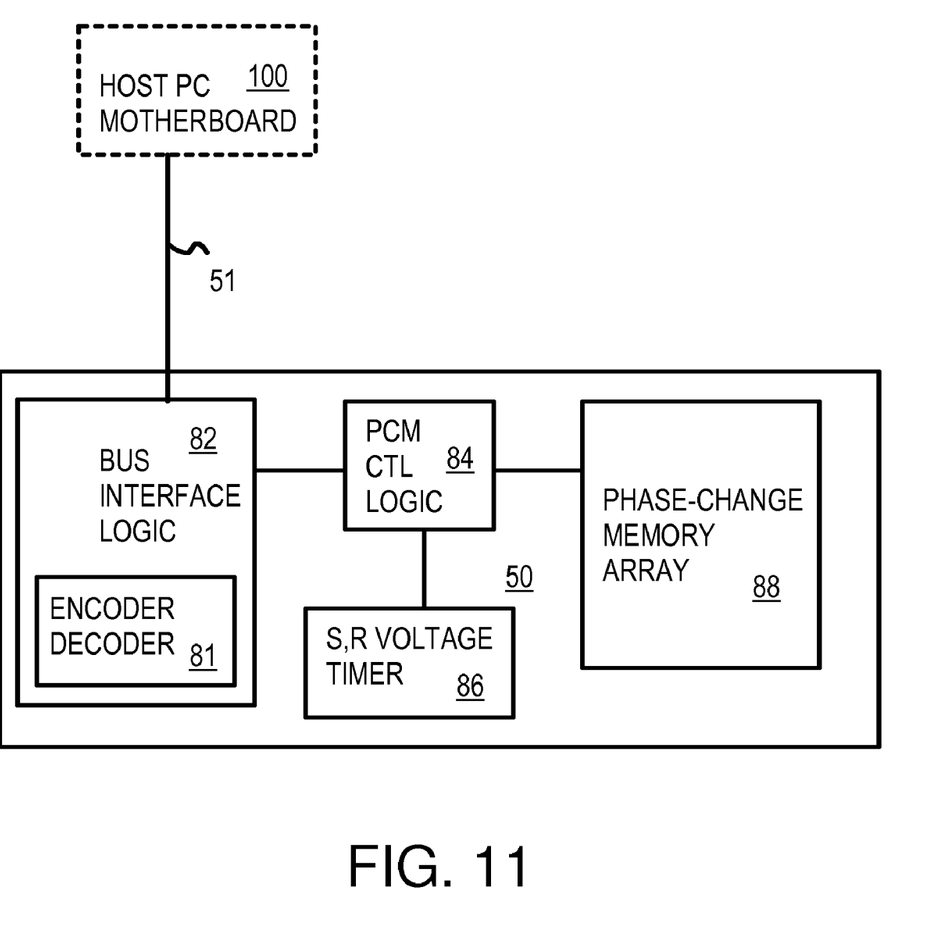
FIG. 11 shows a phase-change memory module with an 8/9 encoder/decoder in a memory controller.

8/9 Encoder In Memory Controller—FIG. 11

FIG. 11 shows a phase-change memory module with an 8/9 encoder/decoder in a memory controller. PCM memory module 50 can replace a standard DRAM memory module in some embodiments, but may require different applied voltages and differing control signals and timings than standard DRAM modules.

PCM array 88 may be one or more PCM chips each with blocks such as shown in FIG. 4. Data is stored in non-volatile phase-change memory cells, so data is retained when power is lost. PCM control logic 84 translates DRAM-type signals into PCM-type signals that can interface with PCM array 88. Set, reset voltage timer 86 generates voltages applied to PCM array 88 for generating set and reset currents when PCM array 88 does not contain internal set, reset timers and voltage generators. Set, reset voltage timer 86 can also include timers to generate pulse widths that are needed for set and reset write operations.

Bus interface logic 82 sends and receives signals from motherboard 100 over memory bus 51. For example, motherboard 100 may send data to PCM memory module 50 as serial-bus packets rather than as individual addresses and data. Bus interface logic 82 can parse these packets and generate PCM-specific control signals, and reformat address and data for use by PCM array 88.

PCM memory module 50 may be a fully-buffered memory module that has multiple bus connections to upstream and downstream memory modules. For example, northbound lanes of several serial lines in parallel may carry differential data upstream to the north bridge controller, or to an intervening memory module that forwards the data upstream to the north bridge controller. Southbound lanes may carry data away from the CPU and its north bridge controller to a daisy chain of downstream memory modules.

Encoder 400 and decoder 450 (FIGS. 8,9) can be included in each memory chip of PCM array 88. For example, the encoder and decoder can be added as part of data buffers 126 (FIG. 4) on the PCM chip. Alternately, an encoder/decoder 81 can be added in the data path, such as in bus interface logic 82 as shown in FIG. 11.

ALTERNATE EMBODIMENTS

Several other embodiments are contemplated by the inventors. For example the MSB indicator could be cleared when inversion occurs, rather than being set. This reduces the number of 0's in the encoded word by 1, thus reducing the peak current. The inversion could be triggered by a different number of 0's, such as greater than 6, or greater than 3, etc.

Rather than concatenating the MSB indicator with the inverted or non-inverted input data word, the MSB could be logically combined with other data-word bits, such as by XOR'ing. While an 8-bit data word has been described, the data word could be other widths, such as 4 bits, 12 bits, 16 bits, or multiples of 8 bits, or other values. The MSB indicator could be added as the LSB, or at some intermediate bit-position in the encoded data word. The meaning of the MSB indicator could be inverted as well. Further levels of encoding could be used, such as to hide stored data by encryption.

While a PCM chip with an internal encoder/decoder has been described, the encoding and decoding functions could be performed outside of the PCM chips, such as by a PCM controller, microcontroller, glue logic, bus controller, or other chips.

Rather than use carry-lookahead adder 402, counting logic could be used, such as combinatorial logic. Carry-lookahead adder 402 could be combined with comparator 404 as a single logic block that generates the select signal when more than half of the bits are 0's. In some embodiments the logic may invert when exactly half the bits are 0's, while other logic may not invert when half are 0's.

The PCM cells can use select transistors in series with the variable resistor as shown, or additional transistors may be added, such as for a dual-port memory with 2 bit lines per cell, and two select transistors that connect to the same alloy resistor. The melting and crystalline temperatures may vary with the alloy composition and with other factors such as impurities. The shape and size of the alloy resistor may also affect these temperatures and set, reset time periods.

The terms set and reset can be applied to either binary logic state. For example, set can refer to changing to the logic 1 state for positive logic, or to changing to the logic 0 state for negative or inverse logic. Likewise, reset is to 0 for positive logic, but inverted logic can reset to 1, such as for active-low logic. Set and reset can also refer to remaining in the previous state, such as setting a cell that is already 1. One system can use both active-high and active-low logic domains, and logic can refer to the physical states of the memory cells, or the data read at the I/O of a memory chip, or at some other point.

Directional terms such as upper, lower, up, down, top, bottom, etc. are relative and changeable as devices are rotated, flipped over, etc. These terms are useful for describing the device but are not intended to be absolutes. Some embodiments may have chips or other components mounted on only one side of a circuit board, while other embodiments may have components mounted on both sides.

The waveforms shown are idealized. Actual waveforms, such as those measured on lab equipment such as an oscilloscope, may have different shapes, slopes, and noise. Pulses may be offset in time relative to each other to further reduce peak currents, and other techniques may be used to reduce peak currents.

The encoder/decoder may be included as part of a memory controller, microcontroller, serial engine, DMA, PCM memory controller, transaction manager, or other controllers. Functions can be implemented in a variety of ways. Functions can be programmed and executed by a CPU or other processor, or can be implemented in dedicated hardware, firmware, or in some combination. Many partitioning of the functions can be substituted.

A standard flash, DRAM, or SRAM controller may be integrated with the PCM controller to allow for accessing these various kinds of memories. Routines may contain instructions that are part of the operating system, basic input-output system (BIOS), manufacturer-specific routines, and higher-level application programs, and various combinations thereof. Various modified bus architectures may be used. Buses such as the local bus may have several segments isolated by buffers or other chips.

The phase-change memory has been described as having cells that each store one binary bit of data. However, multi-level cells are contemplated wherein multiple logic levels are defined for different values of resistance of the alloy resistor.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A phase-change memory (PCM) comprising:

a data input that receives a data word in response to a write request and a write address;

a data output that outputs a recovered data word in response to a read request and a read address;

a plurality of PCM cells each having a first logical state having an alloy in a crystalline phase and a second logical state having the alloy in an amorphous phase, wherein a resistance of the alloy is higher when in the amorphous phase than when in the crystalline phase;

sense amplifiers for reading a read-codeword stored in the plurality of PCM cells in response to the read address;

write buffers for driving a write-codeword into the plurality of PCM cells in response to the write address;

an encoder, coupled between the data input and the write buffers, for generating the write-codeword from the data word;

wherein the write-codeword has fewer binary bits storable as the alloy in the amorphous state than the data word for a worst-case data word having all bits storable as the alloy in the amorphous state; and a decoder, coupled between the sense amplifiers and the data output, for generating the recovered data word from the read-codeword, whereby data storable as the alloy in the amorphous state is reduced for a worst-case by encoding.

2. The phase-change memory of claim 1 wherein a PCM cell in the plurality of PCM cells comprises:

a select transistor receiving a word line on a gate, and having a channel between a bit line and a cell node;

an alloy resistor formed from the alloy, coupled between the cell node and an array voltage;

wherein the PCM cell has the first logical state when the alloy resistor has the alloy in the crystalline phase, the alloy resistor having a low resistance that increases a sensing current from the bit line through the select transistor;

wherein the PCM cell has the second logical state when the alloy resistor has the alloy in the amorphous phase, the alloy resistor having a high resistance that reduces the sensing current from the bit line through the select transistor;

wherein the high resistance is larger than the low resistance;

whereby the sensing current is altered by the alloy being in the crystalline phase and the amorphous phase.

3. The phase-change memory of claim 2 wherein the phase-change memory further comprises:

a set current generator, coupled to the bit line, for driving a set current through the select transistor and through the alloy resistor for a set period of time to write the PCM cell into the first logical state in response to a write data input in the first logical state;

a reset current generator, coupled to the bit line, for driving a reset current through the select transistor and through the alloy resistor for a reset period of time to write the PCM cell into the second logical state in response to the write data input in the second logical state;

a reset timer for determining the reset period of time; and a set timer for determining the set period of time;

wherein the reset current is at least twice the set current, and wherein the set current is at least twice the sensing current;

wherein the set period of time is at least double the reset period of time, whereby the PCM cell is set by a lower current for a longer time period, and reset by a higher current and a shorter time period.

4. The phase-change memory of claim 2 wherein the alloy is a chalcogenide glass layer having a melting point that is higher than a crystallization point.

5. The phase-change memory of claim 4 wherein the alloy is an alloy of germanium (Ge), antimony (Sb), and tellurium (Te).

6. A memory system comprising:

phase-change memory means for storing an encoded data word data as binary bits each represented by a chalcogenide glass layer having a melting point that is higher than a crystallization point, the chalcogenide glass layer forming a variable resistor that alters a sensing current when a binary bit is read;

wherein a crystalline state of the variable resistor represents a first binary logic state and an amorphous state of the variable resistor represents a second binary logic state for binary bits stored in the phase-change memory means;

bus controller means for receiving a data word from a host in response to a write request from the host, and for outputting a recovered data word to the host in response to a read request from the host;

encode means, receiving the data word from the bus controller means, for generating an encoded data word;

wherein the encoded data word is stored in the phase-change memory means rather than the data word; and decode means, receiving the encoded data word read from the phase-change memory means, for generating the recovered data word from the encoded data word, the decode means sending the recovered data word to the bus controller means for output to the host;

wherein the encoded data word has fewer binary bits in the second binary logic state than the data word for a worst-case data word that has a maximum number of bits in the second binary logic state, whereby worst-case peak currents to change the variable resistor into the amorphous state are reduced by the encode means.

7. The memory system of claim 6 further comprising:

set current timer means, coupled to the phase-change memory means, for generating a set current for a set period of time to set variable resistors into the crystalline state when the binary bits being written are in the first binary logic state;

reset current timer means, coupled to the phase-change memory means, for generating a reset current for a reset period of time to reset variable resistors into the amorphous state when the binary bits being written are in the second binary logic state;

wherein the reset current is at least twice the set current, and wherein the set current is at least twice a sensing current that passes through the variable resistor during a read operation;

wherein the set period of time is at least double the reset period of time, whereby the variable resistor is set by a lower current for a longer time period, and reset by a higher current and a shorter time period.

8. The memory system of claim 6 wherein the encode means comprises:

detect means for detecting when the data word contains more than a threshold number of binary bits storable in the phase-change memory means as variable resistors in the amorphous state;

indicator bit generator means for generating an indicator bit in an active state in response to the detect means detecting that the threshold number is exceeded;

inversion means for inverting the data word to generate an inverted data word; and output means for outputting the indicator bit and the inverted data word when the indicator bit is in the active state, and for outputting the indicator bit and the data word when the indicator bit is not in the active state, whereby bits are inverted when the threshold number is exceeded.

9. The memory system of claim 8 wherein the encoded data word stored in the phase-change memory means is retained when power is suspended, whereby the encoded data word is stored in non-volatile memory.

10. A phase-change memory with reduced-peak-current comprising:

an array of memory cells in the phase-change memory, each memory cell in the array of memory cells having an alloy resistor that stores binary data as solid phases each having a different resistivity;

wherein the alloy resistor changes from a crystalline state to an amorphous state when a memory cell is written from a logic 1 to a logic 0 in response to a reset current for a reset period of time;

wherein the alloy resistor changes from the amorphous state to the crystalline state when the memory cell is written from a logic 0 to a logic 1 in response to a set current for a set period of time;

wherein the amorphous state has a higher resistance than the crystalline state that is sensed by a sense amplifier;

a data input for receiving a data word to store in the phase-change memory;

an encoder that receives the data word from the data input, for generating a write-codeword by encoding the data word;

data write buffers, coupled between the encoder and the array of memory cells, for writing the write-codeword into memory cells in the array of memory cells;

wherein the sense amplifier is in a plurality of sense amplifiers that are coupled to the array of memory cells, the plurality of sense amplifiers for reading a read-codeword from memory cells in the array of memory cells;

a decoder, coupled to the plurality of sense amplifiers to receive the read-codeword, for generating a recovered data word from the read-codeword; and a data output, coupled to the decoder, for outputting the recovered data word generated by the decoder;

wherein the reset current has a higher peak current than the set current;

wherein the encoder reduces a worst-case number of data bits to reset for a worst-case data word that generates a worst-case peak current, wherein a worst-case write-codeword generated from the worst-case data word has fewer data bits to reset than the worst-case data word;

whereby codewords are stored in the array or memory cells to reduce worst-case peak current.

11. The phase-change memory with reduced-peak-current of claim 10 wherein the worst-case data word has at least 8 bits in the logic 0;

wherein the worst-case write-codeword has 4 or fewer in the logic 0, whereby logic 0 bits written into the phase-change memory are reduced by the encoder.

12. The phase-change memory with reduced-peak-current of claim 10 wherein the data word has N binary bits, wherein N is a whole number;

wherein the write-codeword has N+1 bits, wherein the encoder is a N/N+1 encoder.

13. The phase-change memory with reduced-peak-current of claim 10 wherein the data word has N binary bits, wherein N is a whole number;

wherein the write-codeword has N+2 bits;

wherein the encoder is a N/N+2 encoder.

14. The phase-change memory with reduced-peak-current of claim 13 wherein the write-codeword has no more than N/2 bits in the logic 0 that require the reset current, whereby the write-codeword has half or fewer data bits requiring the reset current.

15. The phase-change memory with reduced-peak-current of claim 10 wherein the encoder comprises:

a peak detector, receiving the data word from the data input, for activating a select signal when the data word has more binary bits in a logic 0 state than in a logic 1 state;

a bit inverter, receiving the data word, for inverting each bit in the data word to generate an inverted data word;

a mux, receiving the data word and receiving the inverted data word, for outputting as a mux output the inverted data word when the select signal is activated, and for outputting as the mux output the data word when the select signal is not activated; and a concatenator, receiving the mux output from the mux, for outputting the write-codeword as the select signal concatenated with the mux output.

16. The phase-change memory with reduced-peak-current of claim 15 wherein the concatenator comprises an additional bit-mux that generates an indicator bit in response to the select signal, wherein the indicator bit is concatenated with the mux output to generate the write-codeword.

17. The phase-change memory with reduced-peak-current of claim 10 wherein the write-codeword comprises an indicator bit and an intermediate data word;

wherein the indicator bit has a first state that indicates that the intermediate data word is the data word;

wherein the indicator bit has a second state that indicates that the intermediate data word is an inverse of the data word.

18. The phase-change memory with reduced-peak-current of claim 17 wherein the decoder comprises:

a bit inverter, receiving the read-codeword, for inverting a subset of bits in the read-codeword to generate an inverted subset; and a mux, receiving an indicator bit in the read-codeword as a select input, for outputting the subset of bits of the read-codeword as the recovered data word in response to the indicator bit being in the first state, and for outputting the inverted subset as the recovered data word in response to the indicator bit being in the second state.

19. The phase-change memory with reduced-peak-current of claim 17 wherein the indicator bit is a most-significant-bit (MSB) of the write-codeword.

20. The phase-change memory with reduced-peak-current of claim 10 wherein the reset current is at least twice the set current.

* * * * *